United States Patent
Christensen et al.

(10) Patent No.: US 9,030,169 B2
(45) Date of Patent: May 12, 2015

(54) BATTERY SYSTEM AND METHOD FOR SYSTEM STATE OF CHARGE DETERMINATION

(75) Inventors: John F. Christensen, Mountain View, CA (US); Jasim Ahmed, Mountain View, CA (US)

(73) Assignee: Robert Bosch GmbH, Stuttgart (DE)

(*) Notice: Subject to any disclaimer, the term of this patent is extended or adjusted under 35 U.S.C. 154(b) by 1093 days.

(21) Appl. No.: 12/396,918

(22) Filed: Mar. 3, 2009

(65) Prior Publication Data

US 2010/0225325 A1  Sep. 9, 2010

(51) Int. Cl.
| | |
|---|---|
| *H02J 7/00* | (2006.01) |
| *H01M 12/00* | (2006.01) |
| *H01M 10/48* | (2006.01) |
| *G01R 31/36* | (2006.01) |
| *H01M 10/052* | (2010.01) |
| *H01M 10/44* | (2006.01) |

(52) U.S. Cl.
CPC ......... *H01M 10/482* (2013.01); *G01R 31/3624* (2013.01); *G01R 31/3665* (2013.01); *H01M 10/052* (2013.01); *H01M 10/441* (2013.01); *G01R 31/3658* (2013.01); *Y02E 60/122* (2013.01); *Y02T 10/7011* (2013.01)

(58) Field of Classification Search
USPC .......... 320/109, 114, 132, 139; 324/427, 432; 429/9, 90, 160, 221, 231.3, 231.1, 429/231.5
See application file for complete search history.

(56) References Cited

U.S. PATENT DOCUMENTS

| | | | | |
|---|---|---|---|---|
| 4,309,644 A | * | 1/1982 | Reimers et al. | 318/139 |
| 5,587,924 A | * | 12/1996 | Rossi | 702/63 |
| 5,703,464 A | * | 12/1997 | Karunasiri et al. | 320/125 |
| 6,127,806 A | * | 10/2000 | Tanjo et al. | 320/132 |
| 6,157,169 A | * | 12/2000 | Lee | 320/132 |
| 6,441,586 B1 | * | 8/2002 | Tate et al. | 320/132 |
| 7,525,285 B2 | * | 4/2009 | Plett | 320/132 |
| 7,593,821 B2 | * | 9/2009 | Plett | 702/63 |

(Continued)

FOREIGN PATENT DOCUMENTS

| | | | | |
|---|---|---|---|---|
| DE | 10208652 A1 | * | 1/2003 | G01R 31/36 |
| FR | 2923022 | | 5/2009 | |
| JP | 55150567 | | 11/1980 | |
| WO | 2009147854 | | 12/2009 | |

OTHER PUBLICATIONS

Verbrugge et al., "Electrochemical and Thermal Characterization of Battery Modules Commensurate with Electric Vehicle Integration." Journal of the Electrochemical Society 149: A45-A53 (2002).

(Continued)

*Primary Examiner* — Drew A Dunn
*Assistant Examiner* — Steve T Chung
(74) *Attorney, Agent, or Firm* — Maginot Moore & Beck LLP

(57) ABSTRACT

A battery system and method of providing a state of charge of for the system in one embodiment includes at least one first cell, the at least one first cell having a first battery chemistry exhibiting a first open circuit potential, and at least one second cell in series connection with the at least one first cell, the at least one second cell having a second battery chemistry exhibiting a second open circuit potential, wherein the at least one first cell exhibits an open circuit potential with a center slope that is greater than the center slope of the open circuit potential exhibited by the at least one second cell.

19 Claims, 3 Drawing Sheets

(56) References Cited

U.S. PATENT DOCUMENTS

| | | | |
|---|---|---|---|
| 7,772,804 B2* | 8/2010 | Bhardwaj et al. | 320/132 |
| 2005/0131487 A1* | 6/2005 | Boveja et al. | 607/40 |
| 2006/0125483 A1* | 6/2006 | Bertness | 324/426 |
| 2006/0238167 A1* | 10/2006 | Arai et al. | 320/132 |
| 2007/0029972 A1* | 2/2007 | Lampe-Onnerud et al. | 320/132 |
| 2007/0139015 A1* | 6/2007 | Seo et al. | 320/132 |
| 2007/0166607 A1* | 7/2007 | Okada et al. | 429/90 |
| 2008/0278115 A1* | 11/2008 | Huggins | 320/134 |
| 2009/0192726 A1* | 7/2009 | Hoffman et al. | 702/27 |

OTHER PUBLICATIONS

Verbrugge et al., "Generalized Recursive Algorithm for Adaptive Multiparameter Regression." Journal of the Electrochemical Society 153: A187-A201 (2006).

International Search Report in corresponding PCT application (i.e., PCT/US2010/025770), mailed May 20, 2010 (3 pages).

* cited by examiner

BATTERY SYSTEM AND METHOD FOR SYSTEM STATE OF CHARGE DETERMINATION

FIELD OF THE INVENTION

This invention relates to determination of the state of charge of a battery system.

BACKGROUND

A number of new battery chemistries are entering the market to provide capabilities required in specialized applications. At one time, the lithium-ion battery market was driven by the use of such batteries in portable electronics which require high energy but only limited life and power. More recently, other industries have focused on the use of batteries. By way of example, batteries are commonly incorporated into power tools and certain types of hybrid-electric vehicles. Each new industry requires different performance characteristics. Certain applications such as automotive applications require battery stability both in terms of battery safety for large packs and long life (at least 10 to 15 years).

Batteries with $Li_yFePO_4$ cathodes and/or $Li_{4+x}Ti_5O_{12}$ anodes have recently captured the attention of the automotive battery community due to their inherent stability and high rate capability. These chemistries, especially when used in combination, suffer two serious drawbacks, one drawback is the low inherent energy density of the chemistries. The energy disadvantage can be offset by the fact that these cells can generally be operated over a wider SOC range without degradation of the output of the battery. Thus, the "usable" energy may be equivalent to or greater than that of alternative chemistries for batteries of comparable size.

A second drawback results from the fact that both chemistries incorporate phase-change materials that exhibit plateaus in the range of ~0.03<y<~0.9 or ~0.3<x<~2.4, resulting in a very flat open-circuit potential (OCP).

Battery state of charge (SOC) is typically estimated using a combination of two techniques: coulomb counting and OCP measurement. The former involves integrating the current that is passed to or from the cell to calculate the change in the cell's capacity. Errors in current measurement render this technique inaccurate over time, while side reactions in the cell lead to further deviations between the estimated and actual SOC. By measuring or estimating the OCP, or rest potential, of the cell, one may use OCP-SOC functional relationships to extract the SOC. The coulomb-counting technique tends to be more accurate at short times or when the current is high, while the OCP technique does better when the cell is at rest or the current is low. The two techniques of SOC estimation are typically combined in a number of different ways to obtain the most accurate estimate of SOC possible at all times.

Thus, flat or shallowly sloping OCPs, while providing some advantages, make accurate SOC estimation very difficult. Accordingly, for cells with a flat (or shallowly sloping) OCP, the OCP-SOC correlation technique does not provide the desired accuracy in determination of the cell SOC. Since coulomb counting alone is inherently inaccurate, a need exists for alternative SOC estimation techniques for systems such as the $Li_{4+x}Ti_5O_{12}/Li_yFePO_4$ cell.

What is needed therefore is a battery system and method that provides the advantages of chemistries which exhibit a flat or shallowly sloping OCP while providing a more accurate SOC determination.

SUMMARY

In accordance with one embodiment a battery system and method of providing a state of charge of for the system includes at least one first cell, the at least one first cell having a first battery chemistry exhibiting a first open circuit potential, and at least one second cell in series connection with the at least one first cell, the at least one second cell having a second battery chemistry exhibiting a second open circuit potential, wherein the at least one first cell exhibits an open circuit potential with a center slope that is greater than the center slope of the open circuit potential exhibited by the at least one second cell.

In accordance with another embodiment, a method of determining the state of charge (SOC) of a battery system includes providing a battery system with at least one first battery cell and at least one second battery cell, wherein the at least one first battery cell exhibits an open circuit potential curve with a slope that is greater than the slope of the open circuit potential curve exhibited by the at least one second battery cell over a range of about 40 percent SOC to about 60 percent SOC, associating each of a plurality of first battery cell voltages with one of a plurality of SOC conditions, storing the associated plurality of first battery cell voltages and plurality of SOC conditions, obtaining the voltage of the first battery cell, comparing the obtained voltage with the stored plurality of first battery cell voltages, and determining the SOC of the battery system based upon the comparison.

In accordance with a further embodiment, a battery system includes at least one first cell, the at least one first cell exhibiting a first open circuit potential curve over a range of state of charge (SOC) conditions, and at least one second cell in series connection with the at least one first cell, the at least one second cell exhibiting a second open circuit potential over the range of SOC conditions, wherein the slope of the second open circuit potential curve is substantially zero and the slope of the second open circuit potential curve is positive.

DESCRIPTION

Figure 1:
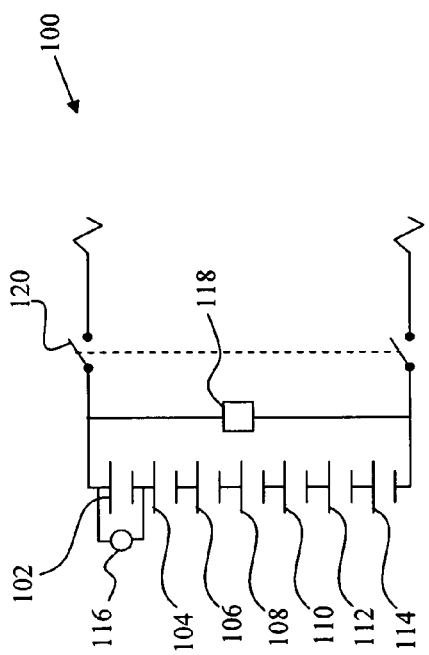
FIG. 1 depicts a schematic of a battery system including a cell with a first type of battery chemistry and a number of cells with other types of battery chemistries in accordance with principles of the present invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a battery system 100 which includes battery cells 102, 104, 106, 108, 110, 112, and 114. The battery cells 102, 104, 106, 108, 110, 112, and 114 are connected in series. A voltmeter 116 is connected in parallel with the battery cell 102 and a coulomb counter 118 is connected in parallel with the series connected battery cells 102, 104, 106, 108, 110, 112, and 114. A switch 120 is provided to selectively couple the battery cells 102, 104, 106, 108, 110, 112, and 114 to one or more circuits which may include a load and a charging circuit.

Figure 2:
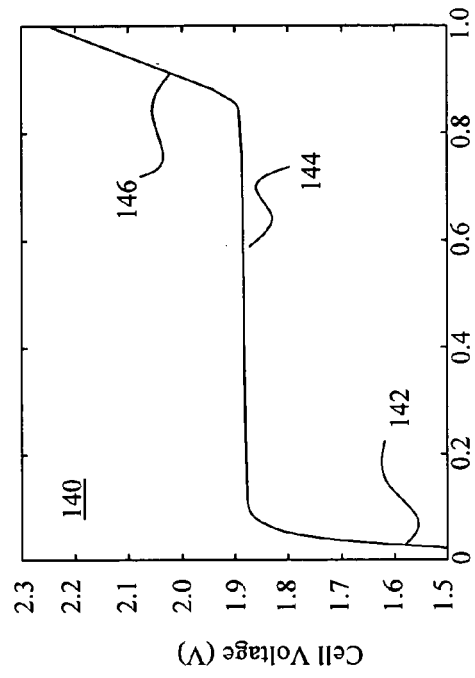
FIG. 2 depicts a graph of the open-circuit potential of a cell which exhibits a substantially flat center slope over a large range of cell charge states.

The battery cell 102 in this embodiment has a battery chemistry using $Li_xC_6$ and $Li_yCoO_2$. FIG. 2 shows a graph 130 of the cell voltage for the battery cell 102 over various states of charge. The graph 130 exhibits two different zones. In a first zone 132, as the cell charge increases from about 0 to about 7 percent SOC, the cell voltage for the battery cell 102 exhibits a rapid rise in voltage up to about 3.65 volts. The average slope in the first zone 132 is about 0.625.

In a second zone 134 which extends from about 7 percent SOC to 100 percent SOC, the voltage exhibits a positive slope as the cell voltage increases from about 3.65 volts to almost 4.14 volts. A "positive slope" as used herein need not be a constant slope of a single value. Rather, a "positive" slope is a slope which consistently tracks in a substantially upward direction. Thus, while both the first zone and the second zone exhibit a positive slope, the average slope in the second zone 134 is about 0.53.

Figure 3:
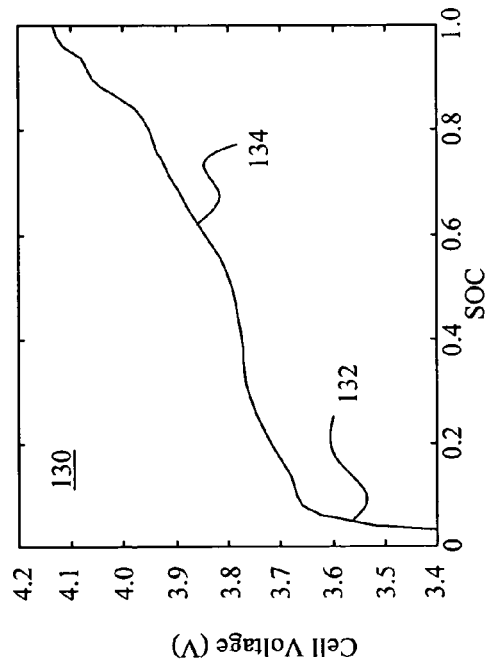
FIG. 3 depicts a graph of the open-circuit potential of a cell which exhibits a positive center slope over a large range of cell charge states.

The battery cell 104 in this embodiment has a battery chemistry with a $Li_yFePO_4$ cathode and a $Li_{4+x}Ti_5O_{12}$ anode. FIG. 3 shows a graph 140 of the cell voltage for the battery cell 104 over various states of charge. The graph 140 exhibits three different zones. In a first zone 142, as the cell charge increases from about 0 to about 10 percent SOC, the cell voltage for the battery cell 102 exhibits a rapid rise in voltage up to about 1.875 volts.

In a second zone 144 which extends from about 10 percent SOC to about 85 percent SOC, the cell voltage exhibits essentially a flat slope as the cell voltage increases from about 1.875 volts to almost 1.9 volts. The slope in the second zone 144 through the central portion of the graph 130 is thus about 0.027.

In a third zone 146, which extends from about 85 percent SOC to 100 percent SOC, the cell voltage exhibits essentially a positive slope as the cell voltage increases from about 1.9 volts to about 2.25 volts. The slope in the third zone 146 through the central portion of the graph 130 is thus about 2.333.

The battery cell 104 has a higher power density and a longer life than the battery cell 102. Additionally, the materials used to fabricate the battery cell 104 are less expensive than the materials used to fabricate the battery cell 102. While the battery cell 104 thus exhibits a number of advantages over the battery cell 102, the essentially flat slope of the cell voltage in the second zone 144 makes the battery cell 104 less desirable when an accurate SOC determination is desired.

Specifically, an OCP voltage reading in zone 142 allows a very accurate determination of the SOC since a small change in SOC results in a large change in voltage. Likewise, an OCP voltage reading in zone 146 allows a very accurate determination of the SOC. Thus, for SOC greater than 85 percent and lower than 10 percent, SOC can be accurately determined using OCP. Between 10 percent and 85 percent, however, a large change in the SOC results in a very small change in voltage. Thus, the mid-range OCP readings are the most inaccurate. Of course, in a vehicular application, wherein limited opportunities are available for recharging the cell, having accurate SOC determinations only when the battery is almost dead is of little use.

In contrast, changes in the SOC of the battery cell 102 result in commensurate changes in the OCP voltage throughout the zone 134, and small changes in the SOC result in even larger changes in the OCP voltage in the zone 132. Thus, accurate SOC determination is possible between about 7 percent SOC and 100 percent SOC with increased accuracy below 7 percent SOC.

The battery cell 102, as noted above, is more expensive has a lower power density, and a shorter life than the battery cell 104. Accordingly, only one battery with the chemistry of the battery cell 102 is provided in the system. The remaining battery cells 106, 108, 110, 112, and 114, may be of the same battery chemistry as the battery cell 104, or they may be of a different battery chemistry to provide other advantages. In alternative embodiments, multiple cells with the battery chemistry of the battery cell 102 may be provided.

Figure 4:
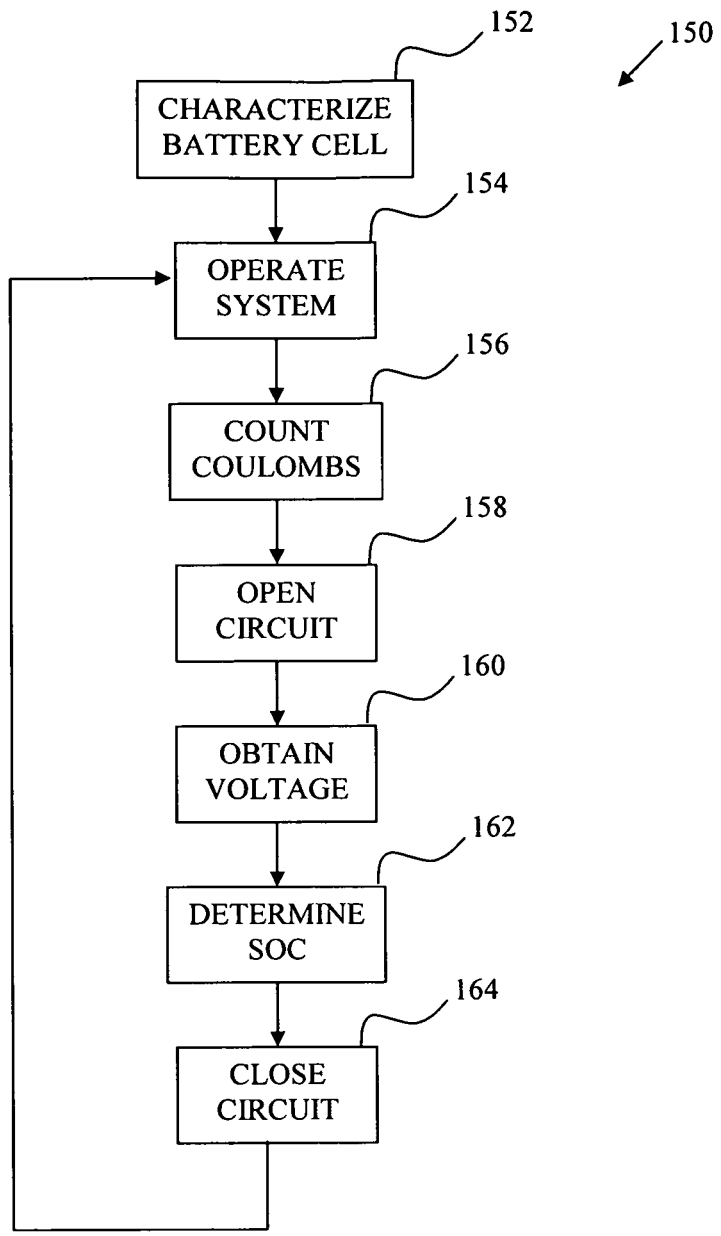
FIG. 4 depicts a method of operating the battery system of FIG. 1 so as to determine the state of charge of the battery system.

Operation of the battery system 100 is discussed with reference to the procedure 150 of FIG. 4. At block 152, the battery cell 102, which is used to monitor the SOC for the battery system 100, is characterized. Characterization of the battery cell 102 identifies the relationship between the cell voltage and state of charge providing the graph 130. At block 154, the battery system 100 is used to supply power to a load, and recharged according to system procedures. At block 156, the charging and discharging activity of the battery system is monitored using the coulomb counter 118. The coulomb counter 118 may be an ammeter with an integration circuit and/or processor for integrating the current flow. The SOC of the battery system 100 may be estimated during operations based upon the coulomb counter 118.

At block 158, the switch 120 is controlled to place the battery system 100 on an open circuit. The time at which the switch 120 is so controlled may be at a predetermined interval. Preferably, the timing is modified in accordance with the operational situation. By way of example, in a system incorporating more than one bank of cells, removal of a bank of cells is effected when the system determines that the load requirements may be provided by the remaining cell banks.

The voltmeter 116 is used to obtain an open circuit voltage of the cell 102 at block 160. The open circuit voltage obtained at block 160 is compared to the cell voltage versus state of charge graph 130, and the SOC associated with the obtained open circuit voltage is determined at block 162. Additionally, the output of the coulomb counter 118 may be combined with the open circuit voltage to provide a SOC determination. At block 164 the switch 20 is closed and the battery system 100 continues operation at block 154.

The procedure 150 may be modified for various applications. By way of example, placing the battery system 100 on an open circuit by opening of the switch 120 may not be desired. In such applications, the procedure 150 may be modified to obtain the voltage of the battery cell 102 when the discharge rate of the battery system 102 is below a predetermined threshold.

The SOC determination at block 162 may be applied to the entire battery system 100 (including battery cells 104, 106, 108, 110, 112, and 114) provided any side reactions are negligible because the same current has been passed by each cell, due to the series arrangement of the battery cells 102, 104, 106, 108, 110, 112, and 114. When side reactions are more significant, a periodic recalibration can be made between the SOC for the battery cell 102 and the battery cells 104, 106, 108, 110, 112, and 114 may be performed. The recalibration may include cell balancing, complete charge or complete discharge of all individual cells, or a sophisticated diagnostic algorithm for SOC determination to identify the correlation between the SOC of the battery cell 102 and the SOC of the battery cells 104, 106, 108, 110, 112, and 114 as is known in the relevant art.

If desired, the proportion of cells exhibiting different types of cell voltage versus state of charge characteristics may be adapted according to the application in which the battery system is to be used. As noted above, battery cells such as the battery cell 102 are typically more expensive than battery cells such as the battery cell 104. To reduce the overall cost of the system and provide increased specific energy, a battery system may be provided with only 1 battery cell such as the battery cell 102 and ninety-nine battery cells such as the battery cell 104. Because only one battery cell is used in the SOC determination, the accuracy of the SOC determination may be decreased. Reduction in the accuracy of the SOC determination in such systems may be mitigated by performing more frequent calibrations.

The battery system may be modified, however, to provide increased accuracy. For example, 10 battery cells such as the battery cell 102 and ninety battery cells such as the battery cell 104 may be used in a system. Although 9 more expensive battery cells are incorporated, the overall cost of this battery system compared to a system using only battery cells such as the battery cell 104 is increased by only 10%. Additionally, assuming the battery cell 102 to have one half the specific energy of the battery cell 104, the overall specific energy of the battery system is reduced by only 5% (excluding any packaging, which would make the difference even less). In such as system, the SOC determination may use the voltage of 10 battery cells to provide more accurate SOC determination.

Figure 5:
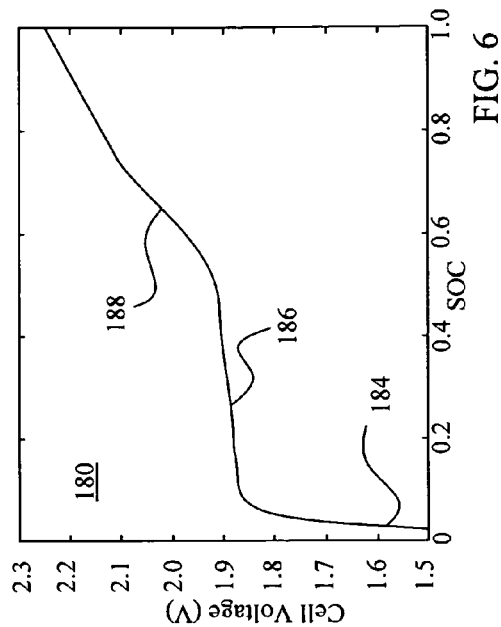
FIG. 5 depicts a graph of the open-circuit potential of an exemplary cell which exhibits a positive slope up to about 40% state of charge and slight positive slope between about 40% state of charge and 100% state of charge.

The battery system may be further modified to provide increased accuracy in the state of charge of a system by using the voltage of different cells over different state of charge ranges. By way of example, FIG. 5 shows a graph 170 of the cell voltage for a battery cell 172 over various states of charge. The graph 170 exhibits three different zones. In a first zone 174, as the cell charge increases from about 0 to about 5 percent SOC, the cell voltage for the battery cell 172 exhibits a rapid rise in voltage up to about 3.55 volts.

In a second zone 176 which extends from about 5 percent SOC to about 40 percent SOC, the voltage exhibits a positive slope as the cell voltage increases from about 3.55 volts to almost 3.8 volts. In a third zone 178 which extends from about 40 percent SOC to 100 percent SOC, the voltage exhibits a positive slope as the cell voltage increases from about 3.8 volts to almost 3.9 volts. Thus, while all three zones 174, 176, and 178 exhibit a positive slope, the slope in the third zone 178 is much smaller than the slope in the zones 174 and 176.

Figure 6:
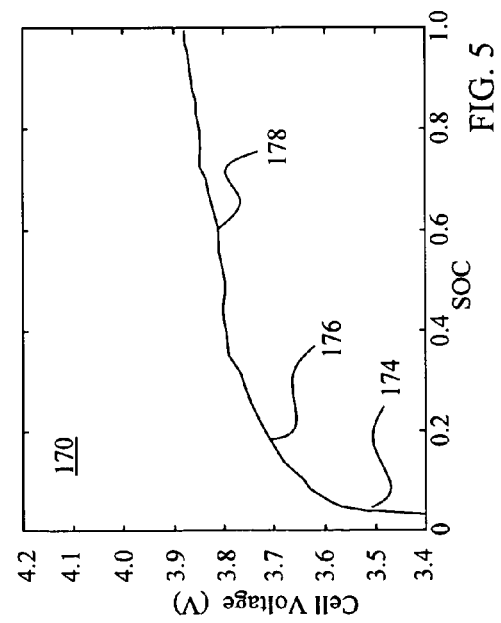
FIG. 6 depicts a graph of the open-circuit potential of an exemplary cell which exhibits a flat slope between about 10% state of charge and 50% state of charge and a positive slope between 50% state of charge and 100% state of charge.

FIG. 6 shows a graph 180 of the cell voltage for a battery cell 182 over various states of charge. The graph 180 exhibits three different zones. In a first zone 184, as the cell charge increases from about 0 to about 5 percent SOC, the cell voltage for the battery cell 182 exhibits a rapid rise in voltage up to about 1.85 volts.

In a second zone 186 which extends from about 5 percent SOC to about 50 percent SOC, the voltage exhibits a relatively flat slope as the cell voltage increases from about 1.85 volts to almost 1.9 volts. In a third zone 188 which extends from about 50 percent SOC to 100 percent SOC, the voltage exhibits a positive slope as the cell voltage increases from about 1.9 volts to about 2.25 volts.

Figure 7:
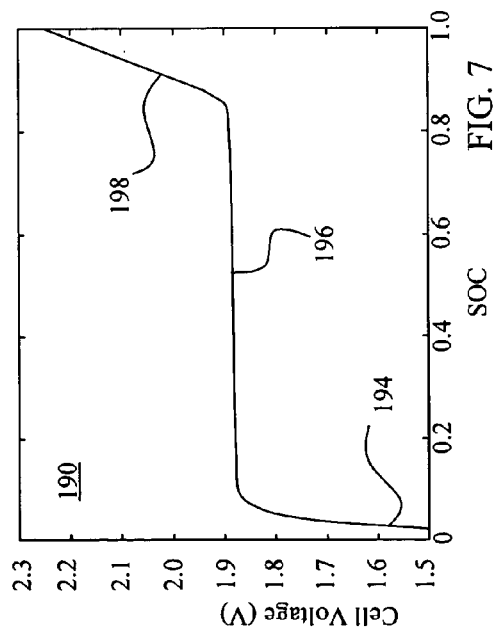
FIG. 7 depicts a graph of the open-circuit potential of an exemplary cell which exhibits a substantially flat center slope over a large range of cell charge states and a positive slope above about 85% state of charge

FIG. 7 shows a graph 190 of the cell voltage for a battery cell 192 over various states of charge. The graph 190 exhibits three different zones. In a first zone 194, as the cell charge increases from about 0 to about 5 percent SOC, the cell voltage for the battery cell 192 exhibits a rapid rise in voltage up to about 1.85 volts.

In a second zone 196 which extends from about 5 percent SOC to about 90 percent SOC, the voltage exhibits a relatively flat slope as the cell voltage increases from about 1.85 volts to almost 1.9 volts. In a third zone 198 which extends from about 90 percent SOC to 100 percent SOC, the voltage exhibits a positive slope as the cell voltage increases from about 1.9 volts to about 2.25 volts.

Accordingly, in a battery system wherein the battery cells 172, 182, and 192 are wired in series, the system SOC may be determine using the open cell voltage of cell 172 from 0 percent SOC to 50 percent SOC. Between 50 percent SOC and 90 percent SOC, the system SOC may be determine using the open cell voltage of cell 182. Finally, between 90 percent SOC and 100 percent SOC, the system SOC maybe determine using the open cell voltage of cell 192. Thus, the system SOC may be accurately determined over the full range of the system SOC. This type of system allows for incorporation of batteries with different operating characteristics, such as power density, energy density, specific power, specific energy, calendar life, and cycle life, while maintaining the ability to accurately ascertain the system SOC.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A battery system comprising:
   at least one first cell, the at least one first cell exhibiting a first open circuit potential curve; and
   at least one second cell in series connection with the at least one first cell, the at least one second cell exhibiting a second open circuit potential curve, wherein the at least one first cell and the at least one second cell have different battery chemistry,
   wherein the at least one first cell exhibits an open circuit potential curve with a slope that is greater than the slope of the open circuit potential curve exhibited by the at least one second cell over a range of at least 40 percent state of charge to at least 60 percent state of charge, and wherein the system is configured to:
   associate each of a plurality of first cell voltages with one of a plurality of SOC conditions;
   obtain the voltage of the first cell;
   compare the obtained voltage with the associated plurality of first cell voltages; and
   determine the SOC of the battery system based upon the comparison.

2. The battery system of claim 1, further comprising:
   a coulomb counter in parallel connection with the series connected at least one first cell and at least one second cell.

3. The battery system of claim 1, further comprising:
   a voltmeter in parallel connection with the at least one first cell.

4. The battery system of claim 1, wherein either:
at least one of an energy density, a specific power, a specific energy, a power density, and a projected lifetime, of the at least one second cell is greater than an energy density, a specific power, a specific energy, a power density, and a projected lifetime, of the at least one first cell; or
a cost of the at least one second cell is less than a cost of the at least one first cell.

5. The battery system of claim 1, further comprising:
at least one third cell in series connection with the at least one first cell, the at least one third cell exhibiting a third open circuit potential curve,
wherein the at least one first cell exhibits an open circuit potential curve with a slope that is greater than the slope of the open circuit potential curve exhibited by the at least one third cell over a range of at least 20 percent state of charge to 80 percent state of charge.

6. The battery system of claim 1, wherein:
the at least one first cell consists of a first number of first cells;
the at least one second cell consists of a second number of second cells; and
the second number is larger than the first number.

7. The battery system of claim 1, wherein:
the at least one first cell comprises $Li_xC_6/Li_yCoO_2$.
x is greater than about 0.3 and less than about 2.4; and
y is greater than about 0.03 and less than about 0.9.

8. The battery system of claim 7, wherein:
the at least one second cell comprises $Li_{4+x}Ti_5O_{12}/Li_yFePO_4$.

9. The battery system of claim 1, wherein the at least one first cell exhibits an open circuit potential curve with a slope that is greater than the slope of the open circuit potential curve exhibited by the at least one second cell over a range of at least 20 percent state of charge to at least 80 percent state of charge.

10. A method of determining the state of charge (SOC) of a battery system comprising:
providing a battery system with at least one first battery cell and at least one second battery cell, wherein the at least one first battery cell exhibits an open circuit potential curve with a slope that is greater than the slope of the open circuit potential curve exhibited by the at least one second battery cell over a range of at least 40 percent SOC to at least 60 percent SOC; and wherein the at least one first battery cell and the at least one second battery cell have different battery chemistry,
associating each of a plurality of first battery cell voltages with one of a plurality of SOC conditions;
storing the associated plurality of first battery cell voltages and plurality of SOC conditions;
obtaining the voltage of the first battery cell;
comparing the obtained voltage with the stored plurality of first battery cell voltages; and
determining the SOC of the battery system based upon the comparison.

11. The method of claim 10, wherein obtaining comprises:
placing the battery system in an open circuit condition.

12. The method of claim 10, wherein obtaining comprises:
determining that a battery system discharge rate is below a predetermined threshold.

13. The method of claim 10, wherein determining the SOC comprises;
monitoring discharge of the battery system using a coulomb counter.

14. A battery system comprising:
at least one first cell, the at least one first cell exhibiting a first open circuit potential curve over a first range of state of charge (SOC); and
at least one second cell in series connection with the at least one first cell, the at least one second cell exhibiting a second open circuit potential curve over the first range of SOC, wherein the at least one first cell and the at least one second cell have different battery chemistry,
wherein the slope of the second open circuit potential curve is positive and the slope of the first open circuit potential curve is less than the slope of the second open circuit potential curve, and wherein the system is configured to:
associate each of a plurality of second cell voltages with one of a plurality of SOC conditions;
obtain the voltage of at least one of the at least one second cell;
compare the obtained voltage with the associated plurality of second cell voltages; and
determine the SOC of the battery system based upon the comparison.

15. The battery system of claim 14, wherein the first range of SOC extends from at least 40 percent SOC to at least 60 percent SOC.

16. The battery system of claim 15, wherein the first range of SOC extends from at least 20 percent SOC to at least 80 percent SOC.

17. The battery system of claim 14, further comprising at least one third cell, wherein:
the at least one second cell exhibits a third open circuit potential curve over a second range of SOC;
the at least one third cell exhibits a fourth open circuit potential curve over the second range of SOC; and
the slope of the fourth open circuit potential curve is positive over the second range of SOC and the slope of the third open circuit potential curve is less positive than the slope of the fourth open circuit potential curve over the second range of SOC.

18. The battery system of claim 17, further comprising:
a voltmeter in configured to provide selective parallel connection with the at least one second cell and the at least one third cell.

19. The battery system of claim 14, further comprising:
a voltmeter in parallel connection with the at least one second cell.

* * * * *